May 31, 1966 D. J. CARLSON 3,254,306
AUTOMATIC GAIN CONTROL CIRCUIT FOR AMPLIFIERS
Filed Nov. 21, 1962
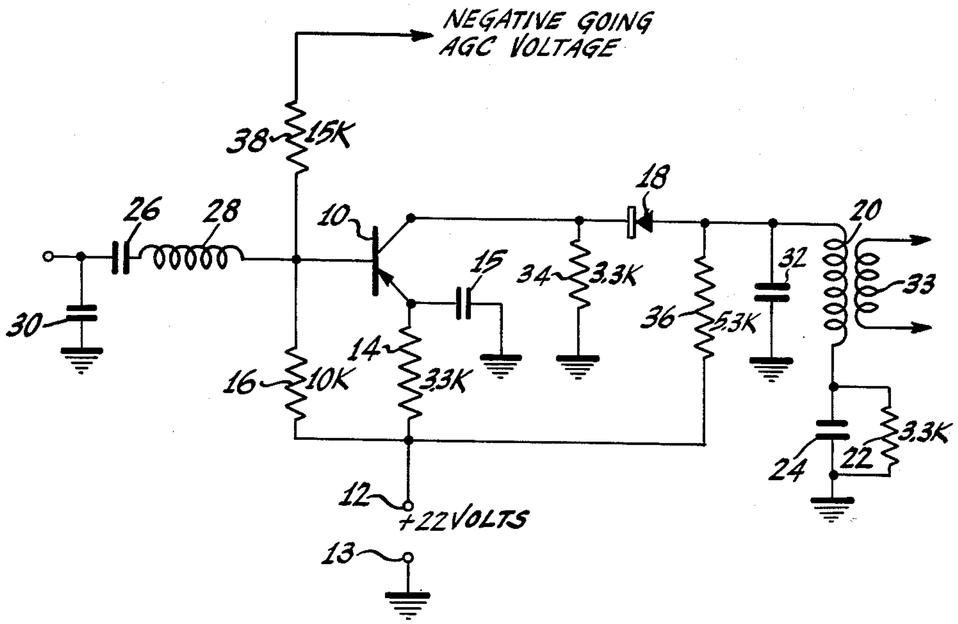
INVENTOR.
DAVID J. CARLSON
BY
Eugene M. Whitacre
ATTORNEY United States Patent Office 3,254,306
Patented May 31, 1966

3,254,306
AUTOMATIC GAIN CONTROL CIRCUIT FOR AMPLIFIERS

David J. Carlson, Princeton, N.J., assignor to Radio Corporation of America, a corporation of Delaware Filed Nov. 21, 1962, Ser. No. 239,117
9 Claims. (Cl. 330—24)

This invention relates to automatic gain control systems for radio signal receivers, and more particularly to gain control systems for radio signal receivers of the type employing semi-conductor devices in the signal translating or amplifying portions thereof.

It has been proposed heretofore that the gain of a transistor amplifier be reduced by the application of AGC voltage which increases the forward bias between the input electrodes of the transistor as signal level increases. Both the input and the output impedance of the transistor are reduced as the forward bias AGC voltage is increased. The lower input impedance of the transistor has a beneficial effect in that distortion due to cross-modulation and overload is reduced. However, the lower output impedance of the transistor has the effect of loading a tuned output circuit for the transistor. Such loading is undesirable in that the response of the tuned circuit is broadened thereby changing its pass-band characteristic and reducing the attenuation of undesired signals.

It is therefore an object of this invention to provide an improved transistor amplifier in which forward bias AGC voltage is applied to the transistor.

It is a further object of this invention to provide a transistor amplifier having an output circuit in which the loading of the output circuit by the transistor is maintained substantially constant as the forward bias AGC voltage applied to the transistor increases.

According to an embodiment of the invention, a voltage responsive impedance means, such as a diode, is connected between the output electrode of a gain controlled transistor and an output circuit to which the output electrode is coupled. Biasing voltages are applied across the voltage responsive impedance means to render it of low impedance whereby the output electrode is closely coupled to the tuned circuit by way of the impedance means. An AGC voltage is applied to the transistor which increases the forward bias between the transistor input electrodes as signal level increases. The transistor output electrode current flows through a load element which develops a voltage for controlling the conductivity of the voltage responsive impedance means. For strong signals, the voltage is such as to bias the impedance means to a high impedance condition so that the coupling of the transistor output electrode to the tuned output circuit is reduced thereby tending to maintain substantially constant output circuit loading at increased signal levels.

The novel features which are considered to be characteristic of this invention are set forth with particularity in the appended claims. The invention itself, however, both as to its organization and method of operation, will be understood from the following description, when read in conjunction with the accompanying drawing, in which the sole figure is a schematic circuit diagram of an automatic gain controlled transistor amplifier embodying the invention.

Referring to the figure, a junction transistor 10 is provided. Energizing and biasing voltages are supplied to the transistor 10 from a source of voltage, not shown, but connected between the terminals 12 and 13. The negative terminal 13 of the source is connected to a common ground connection, and the positive terminal 12 of the source is connected to the emitter of the transistor 10 through a resistor 14, and to the base of transistor 10 through the resistor 16. The emitter of transistor 10 is connected to a common ground connection by way of a capacitor 15 which is a by-pass capacitor for the frequency of the wave to be amplified. The collector of the transistor 10 is connected to the common ground connection through the series connection of a voltage responsive impedance means such as a diode 18, an inductor 20, and a parallel connected resistor 22 and capacitor 24. The diode 18 is poled so that its cathode is connected to the collector of transistor 10.

Input signals are applied to the base of the transistor 10 through the series connection of a capacitor 26 and an inductor 28. A capacitor 30 is connected between the input terminal of the capacitor 26 and ground. The elements 26, 28 and 30 comprise a filter circuit for passing desired signal waves to the base of the transistor 10 and alternating undesired signals. Output signals from the transistor 10 which appear in a tuned circuit (which is tuned to the desired signal wave) comprising the inductor 20 and a capacitor 32, are coupled to a winding 33 for further amplification and utilization.

Biasing potential is applied across the diode 18 from the source 12–13. A resistor 34 is connected in series with the internal collector to emitter path of the transistor 10 and the resistor 14 across the source 12–13 through the common ground connection. The cathode of diode 18 is connected to the junction of the resistor 34 and the collector of the transistor 10. A further resistor 36 is connected between the diode 18 anode and the positive terminal 12 of the source. The voltage developed across diode 18 due to the described connections thereof, is such as to render the diode conductive in the absence of AGC voltage. The capacitor 24 by-passes resistor 22 for the output waves appearing in tuned circuit 20–32 and prevents loading of the tuned circuit by resistor 22.

An AGC voltage for any suitable source provides a control voltage which becomes more negative as signal level increases. The AGC voltage is applied to the base of the transistor 10 by way of a resistor 38. As received signal level increases, the AGC voltage applied to the base of the transistor 10 decreases the impedance of its collector to emitter path, whereby the current flow through resistor 34 is increased and the voltage drop thereacross increases. Since the voltage applied to the anode of diode 18 is not changed, the forward bias potential across the diode 18 is reduced, whereby the impedance of diode 18 increases. Consequently, as the forward bias AGC voltage applied to the base of the transistor 10 increases in a direction to make the internal collector to emitter path of the transistor decrease, the impedance of the diode 18 increases.

In explaining the operation of the device, it will first be assumed that the signal level applied to the receiver incorporating the above-described amplifier is relatively low. No, or substantially no, AGC voltage is developed. The signal applied to the base of the transistor 10 is amplified by the transistor amplifier stage and appears in tuned circuit 20–32. The current waves appearing in the collector circuit are added to the direct current passing through diode 18, whereby the diode presents no substantial impedance in the transistor collector circuit, and the collector is closely coupled to the output tuned circuit 20–32. However, in the absence of forward bias AGC voltages applied to the base of the transistor 10, the collector to emitter impedance of the transistor is high and the loading of tuned circuit 20–32 by the transistor 10 is low.

If the signal applied to the receiver becomes progressively greater, progressively greater negatively going forward bias AGC voltage is applied to the base of the transistor 10. This AGC voltage reduces the gain of the transistor 10, and at the same time reduces the output impedance of the transistor 10. The transistor 10, except for the diode 18, is connected directly across the tuned output circuit 20–32 for the frequency of operation of the amplifier. The transistor 10 would then load the tuned circuit 30–32 and broaden its tuning in the absence of diode 18. However, as noted above, the progressively increasing forward bias AGC voltage applied to the base of the transistor 10 causes progressively increasing impedance of the diode 18, whereby the coupling of the transistor 10 to the tuned circuit 20–32 is progressively reduced. This decrease in coupling has two effects. First, it cuts down the transfer of the signals appearing at the collector of the transistor 10 to the tuned circuit 20–32, thereby increasing the gain control effect of the AGC voltage over a circuit wherein diode 18 is omitted. Secondly, the decrease in coupling also decreases the loading of tuned circuit 20–32 by the transistor 10, thereby preventing, or substantially reducing, the broadening effect on the tuned frequency of the tuned circuit 20–32, by the transistor 10, as forward bias AGC voltage is applied to the base thereof, over a circuit in which diode 18 is omitted.

Greater loading of the output tuned circuit may be desirable when receiving strong signals than when receiving weak signals. The greater loading of the tuned circuit results in broadening its band pass and therefore in higher quality reception of strong signals. Conversely, lighter loading of the output tuned circuit may be desirable when receiving weak signals, so as to provide sharper tuning and therefore greater amplification of desired signals and greater discrimination against undesired signals. Loading of the tuned circuit by the transistor which provides higher quality reception of strong signals and greater discrimination against undesired signals when receiving weak signals may also be provided by the here disclosed amplifier circuit.

As shown and described, the collector of transistor 10 is coupled to the tuned circuit 20–32 by way of diode 18. This diode may be a junction diode or a point contact diode. However, any impedance element whose impedance increases as decreasing voltage is applied thereacross may be used as the element through which the collector of the transistor 10 is coupled to the tuned circuit 20–32, rather than the diode 18.

What is claimed is:

1. An amplifier comprising:
a transistor having an input and an output electrode, a tuned circuit,
means for applying a signal to be amplified to said input electrode,
means for applying a gain control voltage to said input electrode in such a direction as to render said transistor more conductive, and
means responsive to said gain control voltage coupling said output electrode to said tuned circuit to reduce the loading of said output electrode on said tuned circuit.

2. An amplifier comprising:
a transistor having an input, an output and a common electrode,
a tuned circuit connected in a series circuit including said output electrode, said common electrode and a voltage responsive variable impedance element coupling said output electrode to said tuned circuit,
means for applying a signal to be amplified to said input electrode,
means for applying gain control voltage to said input electrode in the direction to decrease the impedance of the internal output electrode to common electrode path of said transistor, and
means for applying a voltage to said variable impedance element to increase the impedance thereof as a function of transistor conduction.

3. An amplifier comprising:
a transistor having an input, an output and a common electrode,
a tuned circuit connected in a series circuit including said output electrode and said common electrode,
said series circuit also including a voltage responsive variable impedance element connected between said output electrode and said tuned circuit,
means for applying a signal to be amplified to the input electrode of said transistor,
means for applying a gain control voltage to an electrode of said transistor in such a direction as to vary the impedance of the output-common electrode path of said transistor in one direction, and
means to apply control voltage to said variable impedance element so as to vary the impedance thereof in opposite direction.

4. An amplifier comprising:
a transistor having an output, an input and a common electrode, a tuned circuit, a diode rectifier,
means for connecting the output electrode of said transistor through said diode to said tuned circuit,
means for applying biasing potential to said diode to render it conductive,
means for applying a signal to said input electrode,
means for applying a gain control voltage to said input electrode in a direction so as to decrease the impedance of the internal path of said transistor between the collector and common electrode thereof, and
means responsive to said gain control voltage coupled to said diode for reducing said biasing potential applied to said diode as a function of said gain control voltage.

5. An amplifier comprising:
a transistor having a base, an emitter, and a collector electrode, a tuned circuit, a diode,
means for connecting said collector through said diode to one terminal of said tuned circuit,
means for coupling the other terminal of said tuned circuit to said emitter,
means for applying input signals between said base and said emitter electrodes,
means for applying gain control voltages between said base and said emitter in a direction to increase the forward bias between said base and emitter electrodes to reduce the gain of said amplifier,
means for applying an initial biasing potential to said diode in such a direction as to render the diode conductive, and
means for poling said diode in said series circuit to become less conductive as the gain of said amplifier is reduced.

6. An amplifier comprising:
a PNP transistor having a base, an emitter and a collector electrode,
a parallel tuned circuit connected in a series circuit between the emitter and collector of said transistor,
said series circuit including a diode,
the cathode of said diode being connected to said collector and the anode of said diode being connected to said tuned circuit.
means for applying a biasing potential across said diode in a direction to render said diode conductive,
means for applying a signal to said base, and
means for applying a negatively going gain control voltage to said base.

7. A transistor circuit comprising:
a transistor having a base, an emitter and a collector, a tuned circuit,
a diode,
a source of operating potential,
said source, the internal emitter to collector path of said transistor, said diode and said tuned circuit being included in a series circuit, there being a second series circuit including said source, the said internal path of said transistor and a first resistor, and a third series circuit including said source, said tuned circuit and a second resistor, the anode and the cathode of said diode being connected respectively to said second and first resistors, means for applying input signals between said base and said emitter, and means for applying forward bias gain control voltage between said base and emitter.

8. A transistor circuit comprising:

a transistor having a base, a collector and an emitter, a source of operating potential, a resistor connected between said collector and a terminal of said source, a diode and a second resistor connected in series between said collector and another terminal of said source, a tuned circuit connected between the junction of said diode and said second resistor and said first mentioned terminal of said source, connections from said second mentioned terminal of said source to said base and to said emitter, a circuit for applying signals between said base and said emitter, and a circuit for applying gain control voltage between said base and said emitter.

9. In a signal receiver, a transistor having base, emitter and collector electrodes;

means providing an input circuit coupled between said base and emitter electrodes;

circuit means including an impedance element and an operating potential supply source connected to provide a series current path between said collector and emitter electrodes;

means connected to said base electrode for applying a gain control voltage to said base electrode in a direction to increase transistor conduction with increased level of a received signal;

a tuned circuit;

a diode coupling said tuned circuit to said transistor collector electrode, and biasing means connected to render said diode conductive through said impedance element for low levels of received signals, wherein said diode biasmeans and the transistor current through said impedance element co-operate to vary the conductive impedance of said diode as a function of the magnitude of said gain control voltage.

References Cited by the Examiner

UNITED STATES PATENTS

| | | | |
|---|---|---|---|
| 2,860,196 | 11/1958 | Schultz | 330—240 X |
| 3,078,420 | 2/1963 | Bussard | 330—29 |

ROY LAKE, *Primary Examiner.*

N. KAUFMAN, *Assistant Examiner.*